United States Patent [19]

Ohwaki et al.

[11] Patent Number: 4,530,066
[45] Date of Patent: Jul. 16, 1985

[54] COMPACT EXPANDABLE ELECTRONIC SIGNAL PROCESSING APPARATUS

[75] Inventors: Hirotsugu Ohwaki, Isehara; Yutaka Yamashiki, Atsugi, both of Japan

[73] Assignee: Sony Corporation, Tokyo, Japan

[21] Appl. No.: 410,972

[22] Filed: Aug. 24, 1982

[30] Foreign Application Priority Data

Aug. 24, 1981 [JP] Japan .................. 56-132486

[51] Int. Cl.³ .................. G06F 1/00; H05K 5/00; H05K 7/16
[52] U.S. Cl. .................. 364/708; 361/390; 361/391
[58] Field of Search .......... 364/708, 200 MS File, 364/900 MS File; 235/1 D; 361/390, 391, 394; 368/88, 276–278; 312/298, 299, 352

[56] References Cited

U.S. PATENT DOCUMENTS

| 3,270,253 | 8/1966  | Binder et al. | 361/391 |
| 3,289,044 | 11/1966 | Ginsberg      | 361/391 |
| 3,675,084 | 7/1972  | Jammaud       | 361/390 |
| 4,002,892 | 1/1977  | Zielinski     | 364/708 |
| 4,017,725 | 4/1977  | Roen          | 364/708 |
| 4,084,242 | 4/1978  | Conti         | 364/708 |
| 4,084,250 | 4/1978  | Albertine et al. | 364/708 |
| 4,086,655 | 4/1978  | Tanimoto et al. | 364/709 |
| 4,120,039 | 10/1978 | Fischer       | 364/709 |

FOREIGN PATENT DOCUMENTS

2607868 9/1976 Fed. Rep. of Germany ...... 364/708

Primary Examiner—James D. Thomas
Assistant Examiner—Dale M. Shaw
Attorney, Agent, or Firm—Lewis H. Eslinger; Alvin Sinderbrand

[57] ABSTRACT

An electronic signal processing apparatus, such as, a personal computer, is basically composed of a power section for providing DC operating power from an AC power source and a main signal processing section operative by the DC operating power for performing the minimal necessary functions. The power and main signal processing sections are mechanically connected for relative sliding movements between closely adjacent positions minimizing the overall dimensions of the apparatus and spread-apart positions in which a space is defined between the power and main signal processing sections for accommodating at least one additional signal processing or handling section by which the functional capabilities of the apparatus are expanded.

19 Claims, 23 Drawing Figures

COMPACT EXPANDABLE ELECTRONIC SIGNAL PROCESSING APPARATUS

BACKGROUND OF THE INVENTION

1. Field of the Invention

This invention relates generally to an electronic signal processing apparatus, such as, a personal computer, and more particularly is directed to an improved apparatus of that type which the functional capabilities of the apparatus may be expanded by coupling additional signal processing or handling sections to the basic components or sections of the apparatus required for performing the minimal necessary functions.

2. Description of the Prior Art

It has been known to provide a personal computer which can be purchased as a simple or basic apparatus equipped to perform only the minimal necessary functions so as to reduce the initial purchase price of the apparatus and to simplify its exterior appearance. To such basic apparatus there may be added various additional signal handling or processing sections or units for expanding the functional capabilities of the apparatus in accordance with the individual requirements of the user. Among the existing apparatus that permit the selective attachment of additional sections or units for expanding the functional capabilities of the apparatus there is one type in which the housing of the apparatus, in its basic or simple form, already has a space therein for accommodating the additional units or sections to be subsequently added. Thus, the overall dimensions of the housing are dictated by the space required for the additional units or sections needed for the expanded functional capabilities and, for any user not requiring such expanded functional capabilities, the housing of the apparatus is unnecessarily and undesirably large and clumsy.

In another existing electronic signal processing apparatus intended for use as a personal computer, the basic apparatus is provided with a relatively compact housing of a size determined by the equipment to be housed therein for performing the minimal necessary functions, and additional units required for achieving the expanded functional capabilities are separately housed and merely connected to each other and to the basic apparatus by means of flexible cables. In such apparatus, the additional units or sections housed separately from the basic apparatus tend to undesirably increase the space required for the apparatus having expanded functional capabilities. Further, independent power supplies are needed for the additional units or sections, thereby increasing the size and cost thereof. Moreover, the undesirably long connecting cables extending between the basic apparatus and the additional units or sections are liable to cause various problems, such as, signal deterioration, power supply disturbances and undesired radiation.

OBJECTS AND SUMMARY OF THE INVENTION

Accordingly, it is an obJect of this invention to provide an electronic signal processing apparatus, such as, for example, a personal computer, which may be obtained as a basic apparatus capable of performing the minimal necessary functions, and which may have its functional capabilities expanded while avoiding the previously mentioned disadvantages of the prior art.

More specifically, it is an object of this invention to provide an electronic signal processing apparatus, as aforesaid, which is conveniently compact when provided in its basic state for performing only the minimal necessary functions, and in which one or more additional signal handling or processing sections or units can be incorporated in the basic apparatus for expanding its functional capabilities.

Another object of the invention is to provide an electronic signal processing apparatus, as aforesaid, in which, when one or more additional signal handling or processing sections are incorporated in the basic apparatus, the necessary electrical connections are conveniently made without resort to flexible external cables of substantial length.

In accordance with an aspect of this invention, an electronic signal processing apparatus comprises a power section for providing DC operating power from an AC power source, a main signal processing section operative by the DC operating power from the power section and cooperating with the latter for providing the min;imal necessary functions of the basic apparatus, guide means mechanically connecting the power and main signal processing sections for relative sliding movements between closely adjacent positions minimizing the overall dimensions of the apparatus in its basic state and spread-apart positions in which a space is defined between the power section and the main signal processing section, at least one additional signal handling section separable from the power and main signal processing sections and adapted to be accommodated, at least in part, in the space between the spread-apart power section and main signal processing section, and connector means for connecting each additional signal handling section into the signal processing apparatus when the power and main signal processing sections are in their spread-apart positions with the additional signal handling section in the space therebetween.

It is further a feature of preferred embodiments of this invention that the connector means for connecting each additional signal handling section into the signal processing apparatus are disposed between the power section and the main signal processing section when the power and main signal processing sections are slidably moved to their spread-apart positions.

The above, and other objects, features and advantages of this invention, will be apparent in the following detailed description of illustrative embodiments thereof which is to be read in connection with the accompanying drawings in which the same reference numerals are employed to identify like parts in the several views of the drawings.

DETAILED DESCRIPTION OF THE PREFERRED EMBODIMENTS

Figure 1:
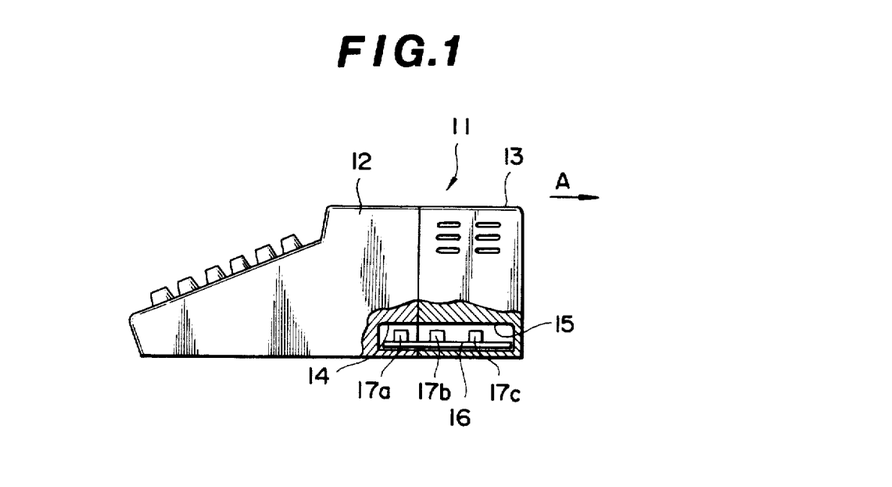
FIG. 1 is a side elevational view, partly cut away and in section, of an electronic signal processing apparatus according to a first embodiment of this invention, and which is shown in its basic state for performing only minimal necessary functions.
Figure 2:
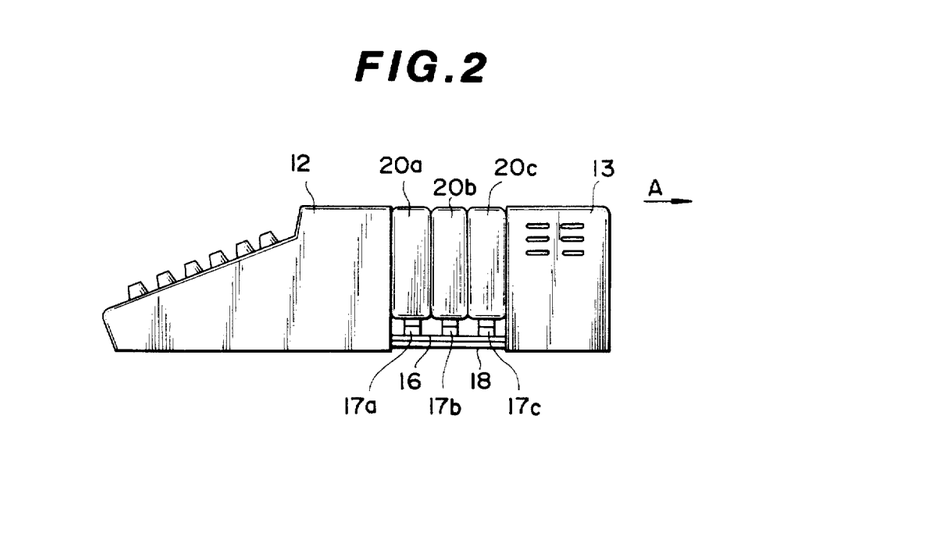
FIG. 2 is a side elevational view similar to that of FIG. 1, but showing the incorporation in the apparatus of a plurality of additional signal handling sections for expanding the functional capabilities of the apparatus.
Figure 3:
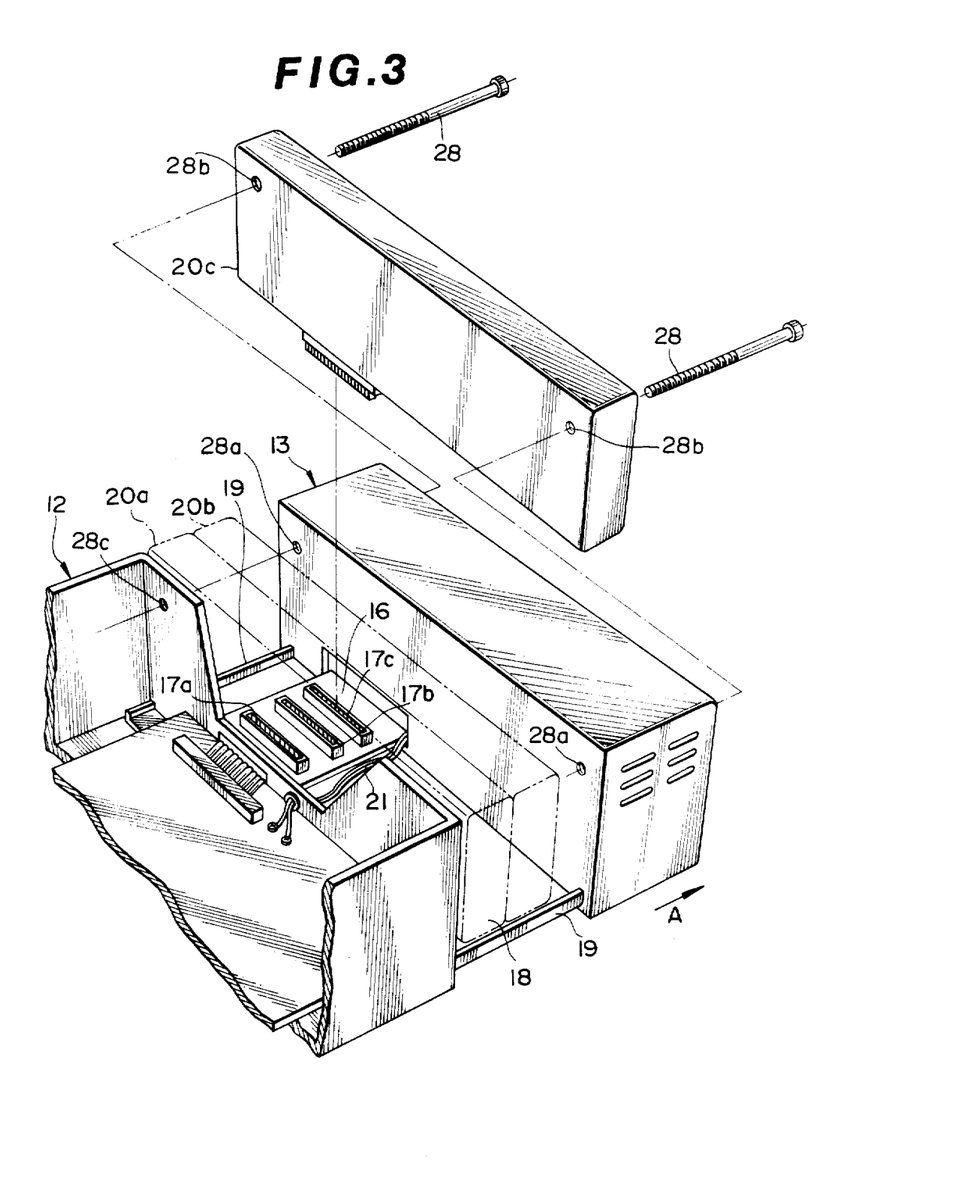
FIG. 3 is a fragmentary perspective view of principal components of the apparatus of FIG. 2, and which are shown partially cut away and in section.

Referring to the drawings in detail, and initially to FIGS. 1-3 thereof, it will be seen that an electronic signal processing apparatus according to an embodiment of this invention is there shown in the form of a personal computer or microcomputer 11 having, at its basic or essential components, a main signal processing section 12 and a power section 13 which are separable from each other. The power section 13 includes an AC/DC converter (not shown) for producing DC operating Power from an AC power source, such as, the usual convenience outlet. The main signal processing section 12 includes the usual keyboard and internal circuits (not shown) and the like operative by the DC operating power from power section 13 for performing the basic or minimal necessary functions of a personal computer. In the configuration of apparatus 11 for performing the basic or minimal necessary functions of a personal computer, main signal processing section 12 and power section 13 are held in closely adjacent positions, as shown on FIG. 1, for example, by suitable screws or other fastening means (not shown) extending through section 13 and into tapped holes in section 12, thereby minimizing the overall dimensions of apparatus 11 in its basic configuration. Preferably, the dimensions of sections 12 and 13, at the surfaces thereof which confront when the sections are closely adjacent, are substantially equal to each other.

Main signal processing section 12 and power section 13 have internal spaces or cavities 14 and 15, respectively, disposed in their lower portions and opening toward each other at the surfaces of sections 12 and 13 which confront when sections 12 and 13 are in their closely adjacent positions (FIG. 1). Such cavities 14 and 15 are provided to house a plurality of connectors 17a, 17b and 17c by which additional signal handling sections may be operatively connected with the basic apparatus 11 when the functional capabilities of the latter are to be expanded, as hereinafter described in detail.

In the embodiment of the invention being here described, connectors 17a, 17b and 17c are fixedly mounted at equally spaced apart locations on a mounting plate 16 so that, when sections 12 and 13 are in their closely adjacent positions shown on FIG. 1, connector 17a is located within cavity 14 of main signal processing section 12 and connectors 17b and 17c are located in cavity 15 of power section 13. A bottom plate 18 constituting a guide (FIGS. 2 and 3) is secured to or formed integrally with power section 13 and extends forwardly, that is, toward section 12, from the bottom of section 13. Bottom plate or guide 18 has a pair of reinforcing ribs 19 (FIG. 3) formed along its opposite side edges and extends slidably through a suitably shaped slot in the back wall of section 12 to guide section 13 for movement relative to section 12 in the direction of the arrow A from the closely adjacent position of FIG. 1 to the spread-apart position of FIGS. 2 and 3 in which a space is defined between main signal processing section 12 and power section 13. When power section 13 is displaced rearwardly in the direction of arrow A, bottom plate or guide 18 is slidably withdrawn from within main signal processing section 12 and, in response to such withdrawal of guide 18, a conventional lost-motion mechanism or the like (not shown) is effective to withdraw mounting plate 16 from cavities 14 and 15 for disposition on bottom plate 18 in the space between sections 12 and 13. Thus, connectors 17a, 17b and 17c are exposed on mounting plate 16 in the space between the spread-apart main signal processing section 12 and power section 13. Of course, the number of the connectors 17a, 17b and 17c exposed on mounting plate 16 in the space between spread-apart sections 12 and 13 may be yaried by varying the extent of the rearward displacement of power section 13 away from main signal processing section 12, and hence the extent to which bottom plate 18 is withdrawn from section 12.

After power section 13 has been spread-apart from main signal processing section 12, one or more additional signal handling sections 20a, 20b and 20c may be disposed in the space between sections 12 and 13, as shown on FIG. 2. The sections 20a, 20b and 20c are desirably of the same thickness and preferably have dimensions, in the directions of their width and height, to fill the space between the spread-apart sections 12 and 13. Upon inserting one or more of the additional sections 20a, 20b and 20c downwarldy into the space between sections 12 and 13, a connector at the bottom of each such inserted additional section is coupled with a respective one of the connectors 17a, 17b and 17c positioned at the bottom of the space, thereby to connect the necessary signal lines which, in the case of a personal computer, may include a data bus, an address bus, a control bus and the like. The electrical connections of such signal lines to and from connectors 17a, 17b and 17c are simply provided by forming the mounting plate 16 for connectors 17a-17c as a printed circuit board with the necessary lines printed thereon, for example, as in a so-called mother board. The DC operating power from power section 13 may be transmitted to main signal processing section 12 across the space therebetween by means of flexible lead wires or cords 21 (FIG. 3) extending along a side or sides of connector mounting plate 16.

After one or more of the additional signal handling sections 20a-20c have been interposed between sections 12 and 13, all of the sections are secured to each other, for example, by means of screws 28 extending through holes 28a in power section 13 and holes 28b in each additional signal handling section 20a, 20b or 20c prior to being threaded into tapped holes 28c in main signal processing section 12. Thus, the apparatus with the desired expanded functional capabilities constitutes a unified structure which is as compact as the desired functional capabilities will permit. In general, the additional signal handling sections 20a, 20b, 20c for selective inclusion in the signal processing apparatus or personal computer 11 may include television-monitor RF units, and a variety of interface boards for I-EEE-488, RS-232C, joystick, light pen, tape recorder, floppy disk, printer and other peripheral equipment.

Further, each such piece of peripheral equipment, as well as the interface board therefor, may be incorporated in an additional signal handling section which is adapted to be mounted, at least in part, between main signal processing section 12 and power section 13 similarly to the previously mentioned sections 20a, 20b and 20c. More specifically, as shown on FIGS. 4-6, an additional signal handling section 22 provided for the apparatus 11 according to this invention may constitute a floppy disk unit made up of a disk drive mechanism 22D as its upper portion and integral therewith a lower part 22U in which an interface circuit, a disk control circuit and the like are housed. The lower portion 22U of floppy disk unit 22 is shown to be substantially equal in its dimensions and shape to each of the additional signal handling sections 20a-20c. Accordingly, lower portion 22U of floppy disk unit 22 has a width and height substantially corresponding to the width and height, respectively, of sections 12 and 13 of the basic apparatus 11 at the confronting surfaces of such surfaces 12 and 13, while the thickness of lower portion 22U is substantially equal to the standardized thickness of the additional sections 20a-20c. Thus, lower portion 22U of floppy disk unit 22 may be accommodated in place of one of the additional signal handling sections 20a-20c, in the space between spread-apart sections 12 and 13.

Figure 4:
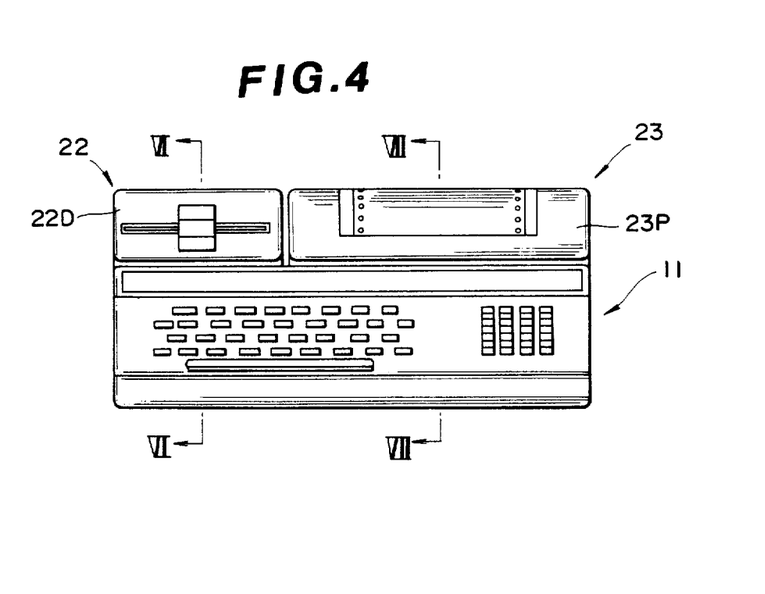
FIG. 4 is a front elevational view of the apparatus of FIG. 1, but with additional signal handling units or sections constituting peripheral equipment being shown incorporated therein.
Figure 5:
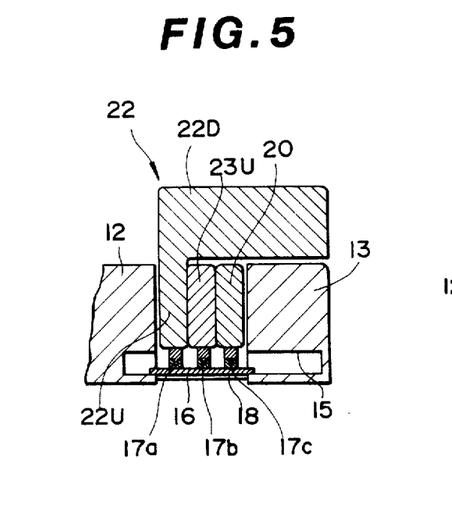
FIGS. 5 and 6 are fragmentary sectional views taken along the lines V—V and VI—VI, respectively, on FIG. 4.

However, the upper portion or disk drive mechanism 22D of floppy disk unit 22 extends out of the space between spread-apart sections 12 and 13 and, as shown particularly on FIG. 5, is enlarged rearwardly so as to overlap the upper surface of power section 13. Further, as shown particularly on FIG. 4, the upper portion or disk drive mechanism 22D of floppy disk unit 22 extends laterally along only the left-hand part of the corresponding lower portion 22U, as viewed from the front.

Figure 6:
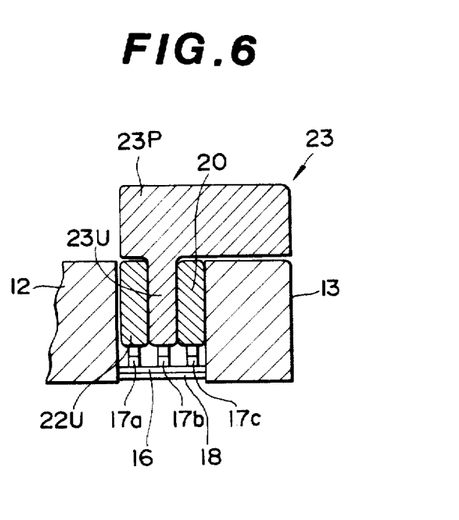

Another example of an additional signal handling section constituted by a piece of peripheral equipment and an interface therefor, and intended for use with the basic apparatus 11 according to this invention is shown on FIGS. 4-6 to constitute a printer unit 23 which includes an upper portion or printer mechanism 23P and, integral therewith, a lower portion 23U which is similar in dimensions and shape to the lower portion 22U of floppy disk unit 22. Thus, lower portion 23U of printer unit 23 can be accommodated in the space between spread-apart sections 12 and 13 of the basic apparatus 11, for example, between lower portion 22U of floppy disk unit 22 and an additional signal handling section 20, as shown on FIGS. 5 and 6. The printer mechanism 23P extends out of the space between sections 12 and 13 and is shaped similarly to disk drive mechanism 22D so as to overlap the upper surface of power section 13, as shown on FIG. 6. However, printer mechanism 23P extends along only a right-hand part of the respective lower portion 23U, as viewed from the front, so that, when floppy disk unit 22 and printer unit 23 are both assembled with main signal processing section 12 and power section 13 and secured thereto, as by screws 28 on FIG. 3, disk drive mechanism 22D and printer mechanism 23P are disposed in side-by-side relation at the top of the resulting assembly for providing a neat and conveniently compact assembly arrangement in which the overall transverse dimension of the assembly is no greater than that of the basic apparatus or computer 11, as particularly shown on FIG. 4.

Figure 7A:
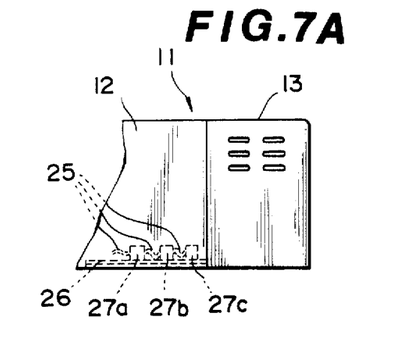
FIGS. 7A and 7B are fragmentary side elevational views similar to those of FIGS. 1 and 2, respectively, but showing a connector assembly for additional signal handling sections in accordance with another embodiment of this invention.
Figure 7B:
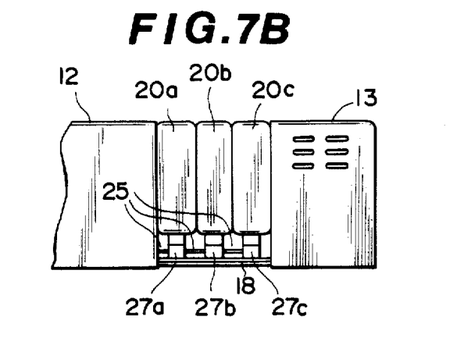

In the embodiment of the invention described above with reference to FIGS. 1-6, connectors 17a, 17b and 17c are fixed at spaced apart locations on mounting plate 16 which is in the form of a so-called mother board having printed circuits thereon through which signals are transferred between main signal procession section 12 and each of the connectors 17a, 17b and 17c. However, other arrangements may be provided for mounting the connectors and providing the desired signal transfers between such connectors and the sections 12 and 13 of the basic apparatus. For example, as shown on FIGS. 7A and 7B, in another embodiment of this invention which is otherwise similar to that described above with reference to FIGS. 1-6, connectors 27a, 27b and 27c are slidably mounted on a connector mounting plate 26, and flexible flat cables 25 extend between such slidable connectors, in sequence, and from connector 27a, to circuit components (not shown) in main signal processing section 12. When only the basic apparatus or personal computer 11 is used, as on FIG. 7A, that is, when sections 12 and 13 are disposed closely adjacent each other, the individually slidable connectors 27a, 27b and 27c can be disposed relatively close to each other on mounting plate 26 within a relatively small space in main signal processing section 12. When power section 13 is moved rearwardly relative to main signal processing section 12 for accommodating one or more of the additional signal handling sections 20a-20c and/or the floppy disk unit 22 and printer unit 23 of FIGS. 4–6 therebetween, the withdrawal of connector mounting plate 26 from section 12 along with guide plate 18 suitably causes connectors 27a, 27b and 27c to be exposed in the space between sections 12 and 13 with the spacing between the successive connectors being suitably expanded to the limits permitted by the flexible flat cables 25 therebetween. Thus, upon completion of the rearward movement of power section 13 away from main signal processing section 12, as on FIG. 7B, the spacing between connectors 27a, 27b and 27c is properly established for coupling with the respective connectors of additional signal handling sections 20a, 20b and 20c, respectively.

Figure 8A:
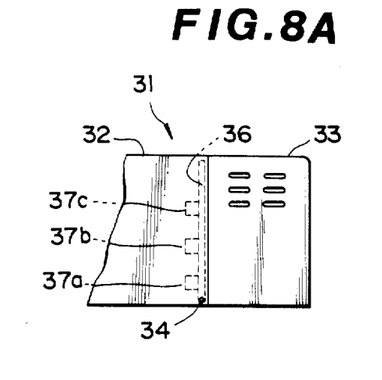
FIGS. 8A and 8B are fragmentary side elevational views similar to FIGS. 7A and 7B, respectively, but showing a connector assembly according to still another embodiment of the invention.
Figure 8B:
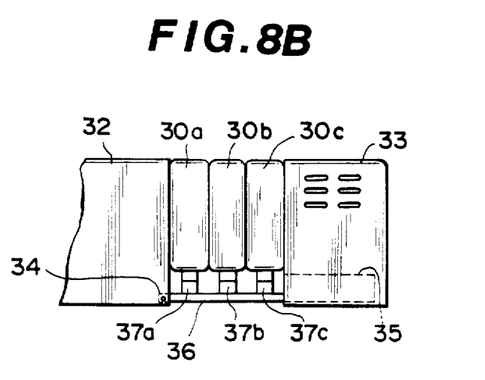

Referring now to FIGS. 8A and 8B, it will be seen that, in accordance with another embodiment of the invention which is also otherwise similar to that described with reference to FIGS. 1–6, the basic apparatus 31 in the form of a personal computer or microcomputer, essentially comprises a main signal processing section 32 and a power section 33 which are relatively movable between closely adjacent positions (FIG. 8A) and spread apart positions (FIG. 8B) in which a space is defined between sections 32 and 33 for accommodating one or more additional signal handling sections 30a, 30b and 30c. In the apparatus 31, a connector mounting plate 36 is pivotally mounted on a shaft 34 which extends across the back of section 32 adjacent the bottom thereof. Fixedly spaced apart connectors 37a, 37b and 37c are disposed on pivoted mounting plate 36 which, similarly to the mounting plate 16, may have printed circuits thereon for transmitting signals to and from the connectors 37a–37c. It will be seen that, when main signal processing section 32 and power section 33 are closely adjacent each other in the basic configuration of apparatus 31, connector mounting plate 36 is pivoted to a raised or stowed position against the back of section 32 which may be there provided with a suitable recess or cavity (not shown) for accommodating the stowed connectors 37a–37c (FIG. 8A). However, when power section 33 is displaced rearwardly from main signal processing section 32, connector mounting plate 36 is pivoted downwardly to its operative position spanning the space between sections 32 and 33 for exposing connectors 37a, 37b and 37c in predetermined positions at which such connectors can be coupled with the corresponding connectors of additional signal handling sections 30a, 30b and 30c, respectively, (FIG. 8B). Then power section 33 is again secured to section 32, as previously described with reference to the embodiment of FIGS. 1–6, so that additional signal handling units 30a–30c are firmly sandwiched and held therebetween. As shown on FIG. 8B, a cavity or space 35 opening at the front of power section 33 is desirably formed in the lower portion of power section 33 so that, in the event that only one or two of the additional signal handling sections 30a–30c is employed, the unused connector 37c or connectors 37b and 37c can be accommodated in cavity 35 while permitting the close and secure sandwiching of the additional signal handling section 30a or the additional sections 30a and 30b between main signal processing section 32 and power section 33.

Figure 9A:
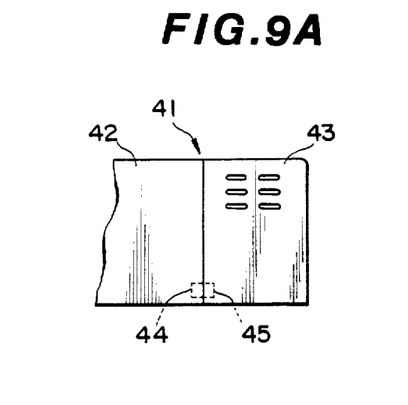
FIGS. 9A and 9B are fragmentary side elevational views similar to FIGS. 7A and 7B, but showing a connector assembly according to yet another embodiment of the invention.
Figure 9B:
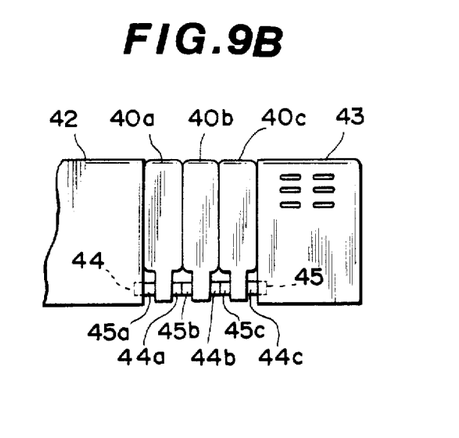

Referring now to FIGS. 9A and 9B, it will be seen that an apparatus 41 according to still another embodiment of this invention which is otherwise generally similar to the embodiment of FIGS. 1–6, essentially comprises, in its basic configuration as a personal computer, a main signal processing section 42 and a power section 43. When such sections 42 and 43 are secured to each other in closely adjacent relation, as on FIG. 9A, a female connector 44 at the back of main signal processing section 42, engages or is coupled with a male connector 45 similarly located at the front of power section 43 for establishing the necessary electrical connections between sections 42 and 43. As shown on FIG. 9B, additional signal handling sections 40a, 40b and 40c to be selectively added to the basic apparatus 41 for expanding the functional capabilities thereof are provided, at opposite sides of their lower portions, with female connectors 44a, 44b and 44c, respectively, and with male connectors 45a, 45b and 45c, respectively. Thus, when power section 43 is spread apart from main signal processing section 42 for accommodating additional signal handling sections 40a, 40b and 40c in sandwiched relationship in the resulting space between sections 42 and 43, the necessary electrical connections are effected by coupling together male and female connectors 45a and 44, 45b and 44a, 45c and 44b, and 45 and 44c, respectively. Thus, the connectors on sections 40a–40c form a series thereof which engage the main connector elements 44 and 45 at opposite ends of such series when the main signal processing section 42 and power section 43 sandwich the additional sections 40a–40c therebetween. It will be appreciated that, in the arrangement illustrated on FIGS. 9A and 9B, the means provided for establishing the necessary electrical connections imposes no limit on the number of additional signal handling sections that can be added to the basic apparatus 41 for expanding the functional capabilities of the latter.

Figure 10:
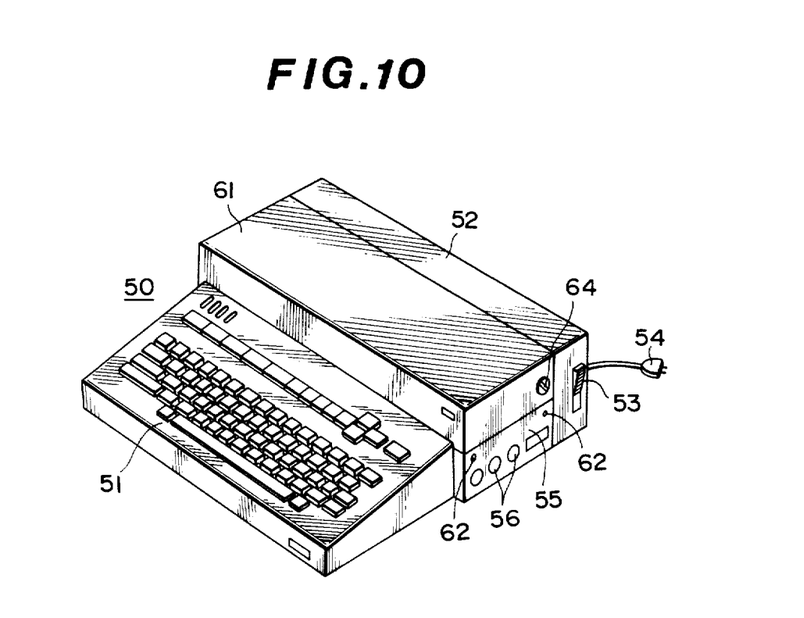
FIG. 10 is a perspective view of an electronic signal processing apparatus according to still another embodiment of this invention, as viewed from the front thereof, and which is shown in its basic state or configuration for performing only the minimal necessary functions.
Figure 11:
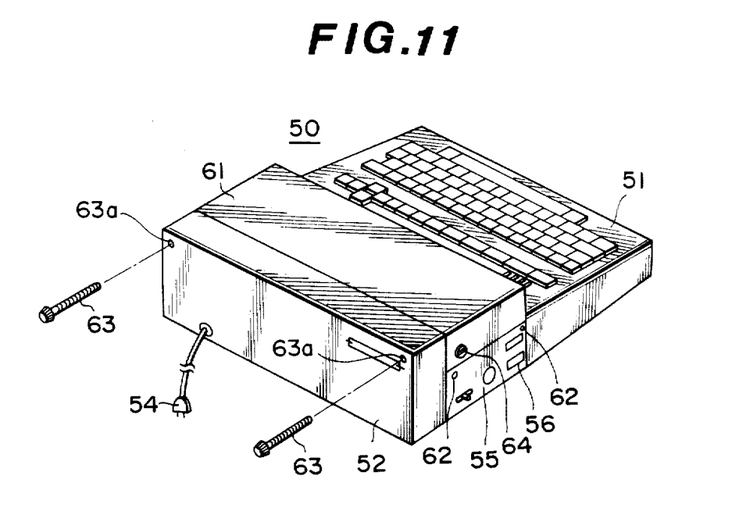
FIG. 11 is a perspective view of the apparatus of FIG. 10, but as viewed from the back thereof.
Figure 12:
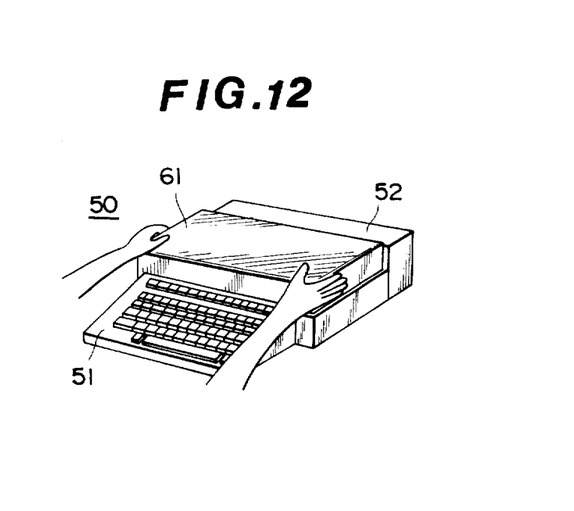
FIG. 12 is another perspective view similar to that of FIG. 10, but illustrating the removal of a cover portion of the apparatus.
Figure 15:
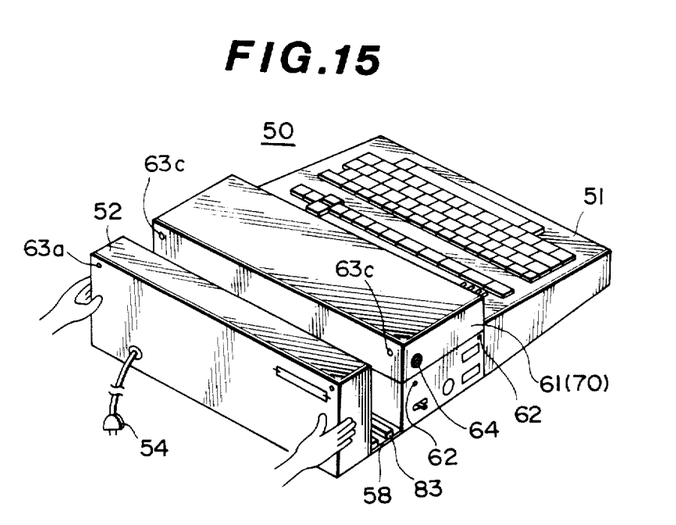
FIG. 15 is a perspective view similar to that of FIG. 11, but illustrating the manner in which a power section of the basic apparatus can be displaced to a spread-apart position relative to a main signal processing section.
Figure 16:
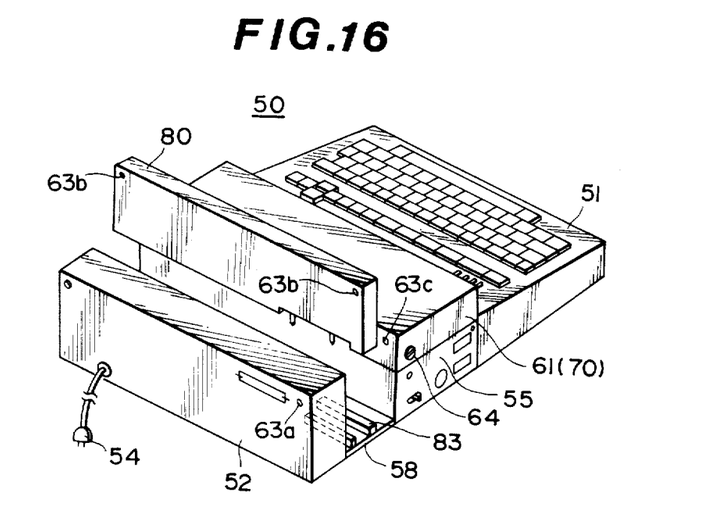
FIG. 16 is a perspective view similar to that of FIG. 15, but illustrating the insertion of an additional signal handling section into the space between the spread-apart power and main signal processing sections.

Referring now to FIGS. 10 and 11, it will be seen that an apparatus 50 according to still another embodiment of this invention essentially comprises, in its basic configuration for performing the minimal necessary functions of a microcomputer, a main signal processing section 51 and a power section 52 located in back of section 51 and being slidably movable relative to the latter between a closely adjacent position (FIGS. 10 and 11) and a spread-apart position (FIGS. 15 and 16). Main signal processing section 51 is shown to include a relatively low forward portion on which there is provided a keyboard having manually actuable keys for indicating respective characters, numerals and symbols. The power section 52 is shown (FIG. 10) to be provided with a power switch 53 and a power supply cord 54 for connection to an AC convenience outlet. The rear portion of main signal processing section 51 has a surrounding wall 55 which is substantially lower than power section 52 and also slightly lower than the forward or keyboard portion of section 51. Connectors 56 are exposed through holes in the side of wall 55 for connection with peripheral equipment, such as, a CRT monitor, light pen, a cassette tape or other data recorder, a printer and the like. Printed-circuit boards and other circuit elements (not shown) are desirably located below the keyboard of main signal processing section 51 and also in the region of section 51 surrounded by wall 55, as at 57 on FIG. 13, so as not to exceed the height of the latter. A removable cover 61 is included as a part of main signal processing section 51 when apparatus 51 is in its basic configuration and includes a substantially rectangular top wall and a depending flange along its side and front and back for defining a downwardly opening space within cover 61. The lower edge of such flange of cover 61 suitably interfits with the upper edge of wall 55, and the flange of cover 61 is further dimensioned so that, when power section 52 is closely adjacent the back of main signal processing section 51, the top of cover 61 is at the same level as the top of power section 52. Cover 61 is adapted to be firmly secured to wall 55 of section 51 by means of screws 62 which pass through holes in the sides of wall 55 and are threadably received in tapped holes, provided, for example, in tabs (not shown) depending from the lower edge of cover 61. As shown particularly on FIG. 11, pins 63 are extended forwardly through holes 63a provided in power section 52 and through holes 63c (FIG. 15) in the back portion of cover 61. Locking screws 64 extend threadably through holes in the sides of cover 61 for locking engagement with the portions of pins 63 extending within cover 61, thereby securing power section 52 in its position closely adjacent the back of main signal processing section 51. It will be appreciated that, in the basic configuration of apparatus 50 shown on FIGS. 10 and 11, cover 61 and wall 55 exert a shielding effect in respect to the printed-circuit boards and other circuit elements contained within section 51.

Figure 13:
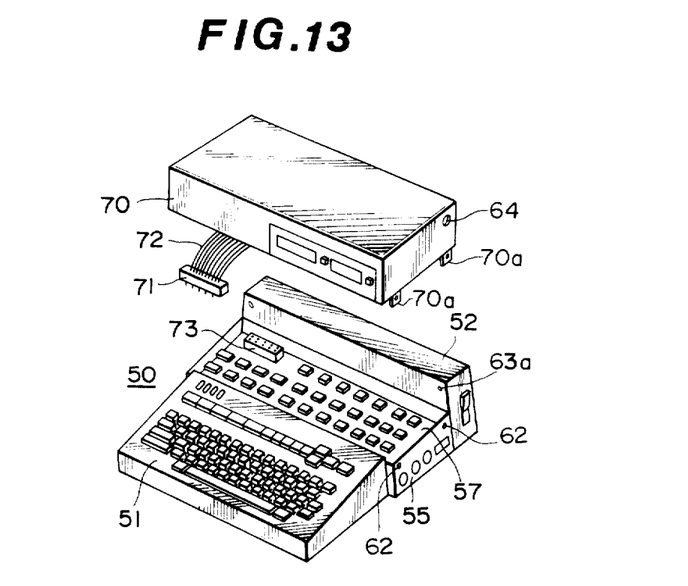
FIG. 13 is another perspective view of the apparatus of FIG. 10, but illustrating the replacement of the removed cover portion by an additional signal handling section or unit.
Figure 14:
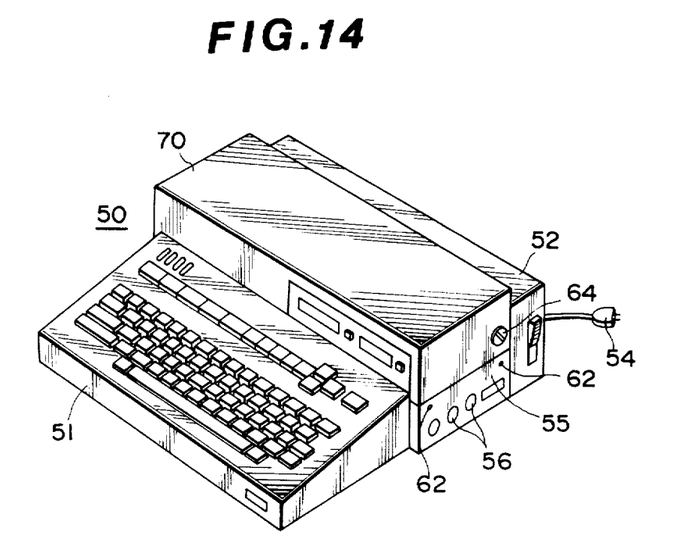
FIG. 14 is a perspective view similar to that of FIG. 10, but showing the apparatus after the additional signal handling section of FIG. 13 has been secured in position in place of the removable cover portion.

Referring now to FIG. 13, it will be seen that a floppy disk drive unit or section 70 for use with the basic apparatus 50 is shaped and dimensioned to be interchangeable with cover 61 and includes a connector plug 71 connected with the bottom of section 70 by way of flexible flat cables 72 so as to be adapted for engagement or coupling with a connector jack 73 on printed circuit board 57 of main signal processing section 51. The disk to be employed in disk drive unit or section 70 may be of the kind referred to as a "micro-floppy" disk having a diameter of approximately 3.5 inches, and disk drive section 70 may be of the dual-drive type so as to accept two of the micro-floppy disks simultaneously. Similarly to cover 61, the housing of floppy disk drive section 70 is provided with holes therein for the insertion of the pins 53 and set screws 64, and the housing of section 70 further has depending tabs 70a (FIG. 13) with tapped holes therein for receiving the screws 62 by which floppy disk drive section 70 is secured above wall 55 in place of cover 61 of the main signal processing unit 51.

Figure 17:
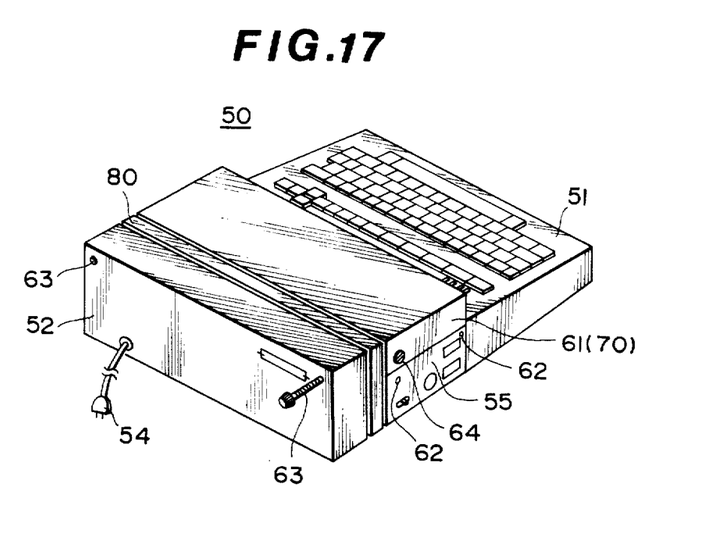
FIG. 17 is a perspective view similar to that of FIG. 16, but illustrating the securing of the additional signal handling section between the power and main signal processing sections.
Figure 18:
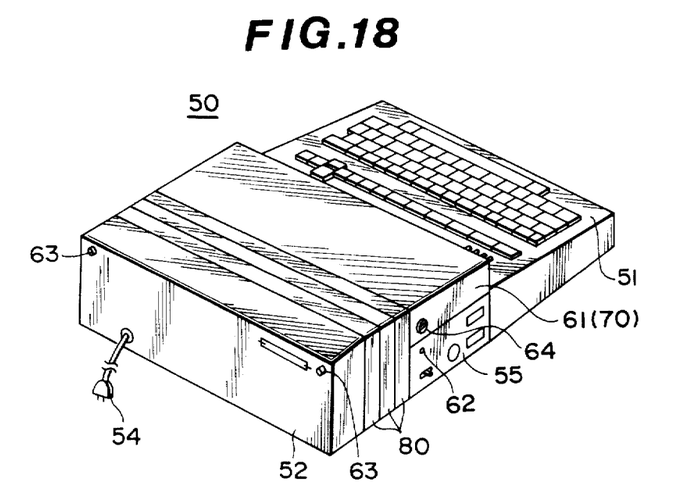
FIG. 18 is a view similar to that of FIG. 17; but illustrating a plurality of additional signal handling sections secured between the power and main signal processing section of the basic apparatus.
Figure 19A:
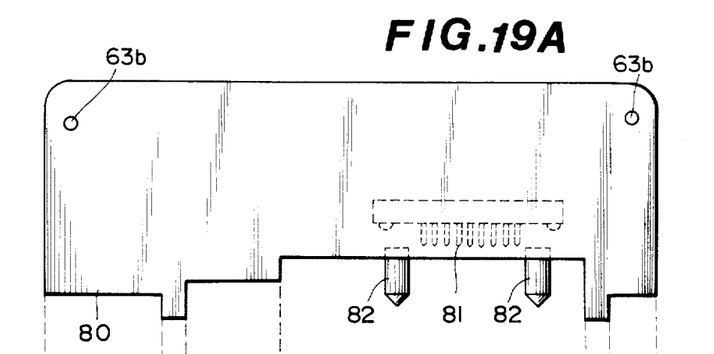
FIGS. 19A and 19B are respectively a back elevational view and a bottom view of one of the additional signal handling sections that may be added to the basic apparatus, as in FIGS. 16, 17 and 18.
Figure 19B:
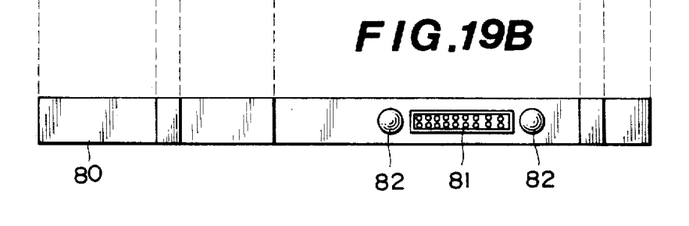

Referring now to FIGS. 15 and 16, it will be seen that, in the apparatus 50 according to this invention, power section 52 has a guide plate 58 extending forwardly from its bottom portion and being suitably received slidaly in main signal processing section 51 so as to mount power section 52 for sliding movement between the position closely adjacent the back of section 51, for example, as on FIGS. 10-14, and positions spread apart from the main signal processing section 51 so as to define a space between sections 51 and 52 in which one or more additional signal handling sections 80 may be accommodated. Each of the additional signal handling sections 80 is shaped and dimensioned so as to be substantially equal to both width and height to the power section 52 at the front surface of the latter, as is apparent on FIGS. 17 and 18. As shown on FIGS. 19A and 19B, each additional signal handling section 80 which may, for example, constitute a controller unit for a ROM pack or the like, has a connector plug 81 at its lower portion and guide pins 82 depending therefrom and by which the respective section 80 is located between main signal processing section 51 and power section 52 for coupling its connector plug 81 with a corresponding connector jack 83 positioned on guide plate 58 (FIGS. 15 and 16). Further, as shown on FIGS. 16 and 19A, each additional signal handling section 80 has through holes 63b to permit the extension therethrough of the pins 63 for securing the respective section 80 between sections 51 and 52.

It will be appreciated that the apparatus 50, in its basic configuration providing minimal functional capabilities, is compact and easily transported, as a unit, from one location to another. When it is desired to provide apparatus 50 with expanded functional capabilities, as by the addition of floppy disk drive unit or section 70 to main signal processing section 51, screws 62 and 64 are removed and pins 63 are withdrawn rearwardly, as shown on FIG. 11, thereby freeing cover 61 for its upward removal, as shown on FIG. 12. Then, as shown on FIG. 13, connector plug 71 of unit or section 70 is inserted into connector jack 73 so as to provide the necessary electrical connections between the floppy disk drive and main signal processing sections 70 and 51, whereupon, the disk drive section 70 is disposed vertically downward on top of wall 55. Then screws 62 are threaded into the tapped holes in tabs 70a for anchoring floppy disk drive section 70 to main signal processing section 51. After pins 53 are reinserted, from in back of power section 52, through holes 63a in the latter and into the corresponding holes in the housing of section 70, set screws 64 are reinstalled in the respective holes in the sides of the housing of unit 70 for locking or setting the pins 63 and thereby securing power section 52 in the position closely adjacent the back of main signal processing section 51.

When it is desired to further expand the functional capabilities of apparatus 50 by the addition thereto of one or more of the additional signal handling sections 80, pins 63 are removed rearwardly from loosening the set screws 64, as shown on FIG. 11, and then power section 52 is moved slidably in the rearward direction, as on FIG. 15, to provide a space between the front of power section 52 and the back of main signal processing section 51 with either the cover 61 or the floppy disk drive unit or section 70 thereon. Each additional signal handling section 80 that is to be employed is then disposed, from above, into the space between sections 51 and 52 while being guided by pins 83 so that connector plug 81 of the additional section 80 will be inserted into the respective connector jack 83 exposed on guide plate or slide 58. After one or more of the additional signal handling sections 80 have been installed in the space between sections 51 and 52, as on FIGS. 17 and 18, section 52 is moved forwardly to closely sandwich the section or sections 80 between power section 52 and main signal processing section 51. Then, pins 63 are again inserted forwardly through the respective holes 63a, 63b and 63c in sections 52 and 80 and cover 61 or the housing of floppy disk drive section 70, respectively. Finally, set screws 64 are tightened to lock pins 63 in position. Thus, as many as three additional signal handling sections 80 may be provided between sections 51 and 52 in a relatively compact integrated assembly, as shown on FIG. 18, for providing the basic apparatus with desirably expanded functional capabilities.

It will be appreciated that, in all of the above described embodiments of electronic signal processing apparatus according to this invention, the additional signal handling sections 20 or 80, when installed for expanding the functional capabilities of the basic apparatus 11 or 50, are disposed between the main signal processing section 12 or 51 and the power section 13 or 52, so that the lines or cables for transmitting signals between such additional signal handling section or sections and the main signal processing section can be relatively short, and further so that there is no need for such signal lines or cables to pass through power section 13 or 52. By reason of the foregoing, signal deterioration is reduced and the harmful influences of external noises are minimized. Further, by reason of the described positional relationship of the various sections of the apparatus, both in its basic configuration and in its various configurations for expanding the functional capabilities thereof, disturbances of the power section and the exposure of other equipment to undesired radiation are diminished, and adequate thermal radiation from the power section is ensured. Since the basic apparatus 11 or 50 and the additional signal handling section or sections 20 or 80, when required for expanding the functional capabilities of the apparatus, are formed into a unitary assembly, the convenient handling of the apparatus, in all of its configurations, is ensured in a relatively low cost arrangement. Moreover, it will be apparent that, in all of the described embodiments, the apparatus according to the invention is at all times as compact as the then desired functional capabilities will allow.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A compact expandable electronic signal processing apparatus comprising:
   a power section for providing DC operating power from an AC power source;
   a main signal processing section for providing primary signal handling functions and being operative by said DC operating power from said power section;
   guide means mechanically connecting said power section and said main signal processing section for relative sliding movements between closely adjacent positions minimizing the overall dimensions of the apparatus and spread-apart positions in which a space is defined between said power section and said main signal processing section;
   a least one additional signal handling section for providing additional signal handling functions and being connectable to and separable from said power and main signal processing sections and which, when connected to said power and main signal processing sections, is accommodated, at least in part, in said space; and
   connector means for connecting each said additional signal handling section into the signal processing apparatus when said power and main signal processing sections are in said spread-apart positions and each said additional signal handling section is disposed in said space;
   said electronic signal processing apparatus being operative, when said power and main signal processing sections are in said closely adjacent positions, to perform said primary signal handling functions, and further being operative, when said power and main signal processing sections are in said spaced-apart positions and at least one of said additional signal handling sections is connected thereto, to perform the additional signal handling functions of the connected additional signal handling sections.

2. An electronic signal processing apparatus according to claim 1; in which said connector means is disposed between said power section and said main signal processing section when said power and main signal processing sections are slidably moved along said guide means to said spread-apart positions.

3. An electronic signal processing apparatus according to claim 2; in which said connector means includes a plurality of connector elements for each connecting a respective additional signal handling section into said signal processing apparatus.

4. An electronic signal processing apparatus according to claim 1; in which the dimensions of said power section and said main signal processing section are substantially equal to each other at least in the direction transverse to the direction of said relative sliding movements.

5. An electronic signal processing apparatus according to claim 4; in which at least a portion of said one additional signal handling section accommodated in said space has a width substantially equal to said dimensions in the transverse direction.

6. An electronic signal processing apparatus according to claim 5; in which said power and main signal processing sections are substantially of the same height at the portions thereof between which said space is defined, and said one additional signal handling section is fully accommodated in said space.

7. An electronic signal processing apparatus according to claim 5; in which said one additional signal handling section has an upper portion extending out of said space and overlapping one of said power and main signal processing sections.

8. An electronic signal processing apparatus according to claim 7; in which said upper portion of said one additional signal handling section has a width smaller than said dimensions of said power and main signal processing section in said transverse direction; and further comprising another additional signal handling section having a lower portion with a width substantially equal to said dimensions in the transverse direction and which is accommodated in said space, and an upper portion of a width smaller than said dimensions in the transverse direction, said upper portion of said other additional signal handling section extending out of said space and overlapping said one of the power and main signal processing sections in side-by-side relation to said upper portion of said one additional signal handling section.

9. An electronic signal processing apparatus according to claim 8; in which said one and other additional signal handling sections are a floppy disk drive device and a printer device, respectively.

10. An electronic signal processing apparatus according to claim 1; in which said main signal processing section has a housing which, at the top of the portion thereof adjacent said power section, is defined by a removable cover; and further comprising another signal handling section interchangeable with said removable cover on said main signal processing section.

11. An electronic signal processing apparatus according to claim 10; in which said other signal handling section includes a floppy disk drive device.

12. An electronic signal processing apparatus according to claim 1; in which said one additional signal handling section is a floppy disk drive device.

13. An electronic signal processing apparatus according to claim 1; in which said one additional signal handling section is a printer device.

14. An electronic signal processing apparatus according to claim 1; further comprising at least another additional signal handling section adapted to be accommodated, at least in part, in said space in sandwiched relation to said one additional signal handling section; and in which said one and another additional signal handling sections are of the same thickness, at least at the parts thereof in sandwiched relation in said space.

15. An electronic signal processing apparatus according to claim 14; in which said connector means includes a plurality of connector elements which are disposed in equally spaced apart relation in said space when said power and main signal processing sections are in said spaced apart positions and which engage said additional signal handling sections respectively, for connecting the latter into the signal processing apparatus.

16. An electronic signal processing apparatus according to claim 15; in which said connector elements are mounted on a rigid support member which is pivoted in respect to one of said power and main signal processing sections for movement between an operative position spanning said space and a stowed position against said one of the power and main signal processing sections.

17. An electronic signal processing apparatus according to claim 15; in which said connector elements are mounted on a rigid support member, at least one of said power and main signal processing sections has a cavity therein for receiving said rigid support member when said power and main signal processing sections are in said closely adjacent positions, and said rigid support member is connected with said guide means to be drawn out of said cavity into said space upon movement of said power and main signal processing sections to said spread-apart positions.

18. An electronic signal processing apparatus according to claim 15; in which one of said power and main signal processing sections has a cavity for storage of said connector elements, said connector elements are movably mounted for movement between closely adjacent stored positions in said cavity and more widely spaced apart operative positions in said space, and said connector elements are flexibly connected to each other and are moved from said stored positions tosaid operative positions in response to movement of said power and main signal processing sections to said spread-apart positions.

19. An electronic signal processing apparatus according to claim 14; in which said connector means include main collector-elements on said power and main signal processing sections which engage each other when said power and main signal processing sections are in said closely adjacent positions and additional connector elements on said parts of the additional signal handling sections in sandwiched relation in said space and which engage each other in succession to form a series of additional connector elements engaging said main connector elements at opposite ends of said series when said power and main signal processing sections are in said spread-apart positions.

* * * * *